United States Patent
Seo

(10) Patent No.: US 6,853,451 B2
(45) Date of Patent: Feb. 8, 2005

(54) ALIGNMENT SYSTEM OF SEMICONDUCTOR EXPOSURE APPARATUS AND DIAPHRAGM UNIT OF THE ALIGNMENT SYSTEM

(75) Inventor: In-Soo Seo, Yongin-shi (KR)

(73) Assignee: Samsung Electronics Co., Ltd., Suwon-si (KR)

(*) Notice: Subject to any disclaimer, the term of this patent is extended or adjusted under 35 U.S.C. 154(b) by 300 days.

(21) Appl. No.: 10/188,090

(22) Filed: Jul. 3, 2002

(65) Prior Publication Data

US 2003/0007153 A1 Jan. 9, 2003

(30) Foreign Application Priority Data

Jul. 3, 2001 (KR) ......................................... 2001-39445

(51) Int. Cl.[7] .............................................. G01B 11/00
(52) U.S. Cl. ...................................... 356/401; 356/400
(58) Field of Search ................................ 356/401, 400, 356/399; 250/491.1, 559.3, 559.42

(56) References Cited

U.S. PATENT DOCUMENTS

| | | | | |
|---|---|---|---|---|
| 4,644,176 A | * | 2/1987 | Heitmann et al. | 250/559.46 |
| 4,749,278 A | * | 6/1988 | van der Werf | 356/401 |
| 5,214,489 A | * | 5/1993 | Mizutani et al. | 356/490 |
| 5,496,669 A | * | 3/1996 | Pforr et al. | 430/22 |
| 5,917,604 A | * | 6/1999 | Dirksen et al. | 356/401 |
| 6,243,601 B1 | * | 6/2001 | Wist | 600/473 |
| 6,297,876 B1 | * | 10/2001 | Bornebroek | 355/67 |

* cited by examiner

Primary Examiner—Layla Lauchman
(74) Attorney, Agent, or Firm—Volentine Francos & Whitt, P.L.L.C.

(57) ABSTRACT

A system for detecting the state of alignment between a reticle and a wafer of a semiconductor exposure apparatus includes a light source, a beam transfer unit, a projection lens, an alignment detector, a controller, and an alarm device. The alignment detector includes a diaphragm, and a photodiode sensor mounted on the incident side of the diaphragm. The photodiode sensor will generate a current when impinged by secondary or higher order beams, i.e. beams other than a +/−primary beam or a tilted +/−primary beam. The controller receives current from the photodiode sensor and operates the alarm when the current exceeds a predetermined value.

9 Claims, 6 Drawing Sheets

ALIGNMENT SYSTEM OF SEMICONDUCTOR EXPOSURE APPARATUS AND DIAPHRAGM UNIT OF THE ALIGNMENT SYSTEM

BACKGROUND OF THE INVENTION

1. Field of the Invention

The present invention relates to a semiconductor exposure apparatus. More particularly, the present invention relates to a system for detecting the alignment of a reticle and a wafer.

2. Field of the Invention

An exposure apparatus is generally used in manufacturing integrated circuit semiconductor devices to downsize an image on a reticle and transfer the downsized image onto a wafer. However, the reticle and the wafer must be exactly aligned before the exposure process is carried out.

An alignment system is used to check the state of alignment of a reticle and a wafer prior to the exposure process. In such a system, alignment beams emitted from a light source are directed onto an alignment mark of the wafer and are diffracted thereat. The diffracted beams pass through the reticle and through holes 200 (see FIG. 1) of a diaphragm of the system, whereupon they impinge an optical sensor. The beams impinging the optical sensor are analyzed to determine the state of alignment of the reticle and the wafer.

Unfortunately, the conventional alignment system has the following drawbacks. The alignment beams become skewed relative to the optical axis due to long-term use or deterioration of the system. In order to adjust the relative angles or positions of the alignment beams, an operator must disassemble a case of an alignment detecting apparatus and check with his/her naked eye whether the alignment beams are propagating normally with respect to the diaphragm. Therefore, it takes a long time to check the relative angles of the alignment beams. Moreover, the main control system may determine the state of alignment to be satisfactory even when the alignment beams are tilted because there is no reliable means for checking the relative angles of the alignment beams. As a result, the reproducibility of the exposure process is poor.

SUMMARY OF THE INVENTION

An object of the present invention is to overcome the foregoing disadvantages and limitations of the prior art. More specifically, one object of the present invention is to provide an alignment system that automatically detects secondary or higher order beams caused by alignment beams tilted relative to the optical axis. Another object of the present invention is to provide a diaphragm unit of such an alignment system.

According to the present invention, a system for aligning a reticle and a wafer of a semiconductor exposure apparatus includes a light source, a beam transfer unit for transferring beams from the light source to an alignment mark on the wafer, a projection lens for projecting a plurality of beams reflected from the alignment mark through the reticle, and an alignment detector for receiving beams reflected from the alignment mark and detecting the state of alignment of the reticle and the wafer based on optical image information provided by the beam. The alignment detector includes a diaphragm having a plurality of holes through which beams from the reticle pass, sensing means for sensing secondary or higher order beams, and a quadrant optical sensor for receiving the beams.

The alignment detector may further comprise a modulator and an analyzer interposed between the diaphragm and the quadrant optical sensor, and a monitor in which the state of alignment can checked by the naked eye.

The sensing means is a photodiode sensor for generating current when impinged by secondary or higher order beams, i.e., those other than the +/−primary beam or a certain titled +/−primary beam. The photodiode sensor is mounted on an incident side of the diaphragm to thereby form a diaphragm unit therewith.

The photodiode sensor has holes formed at positions corresponding to the holes of the diaphragm, and the +/−primary beam passes through the holes of the diaphragm via the holes of the photodiode sensor. Preferably, the number of holes of the photodiode sensor is four.

The system further includes an alarm for informing an operator of an abnormal state, and a controller for sensing current generated from the photodiode sensor to control the operation of the alarm.

DETAILED DESCRIPTION OF THE PREFERRED EMBODIMENTS

Figure 1:
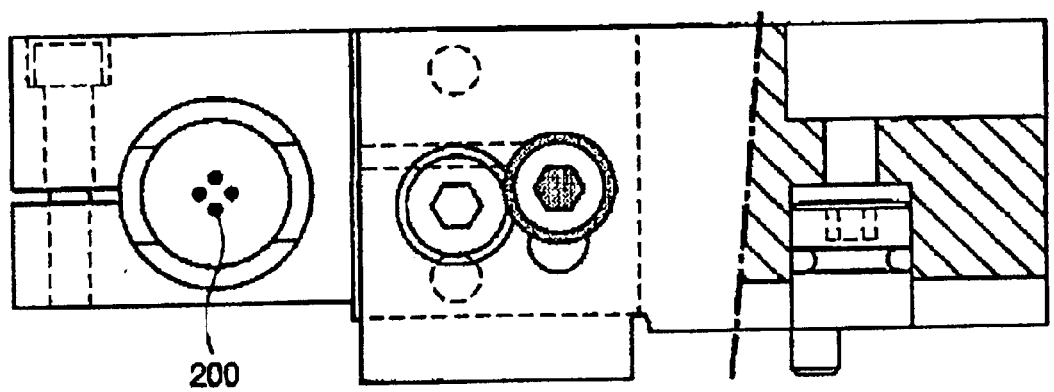
FIG. 1 is a front view of a conventional diaphragm.
Figure 2:
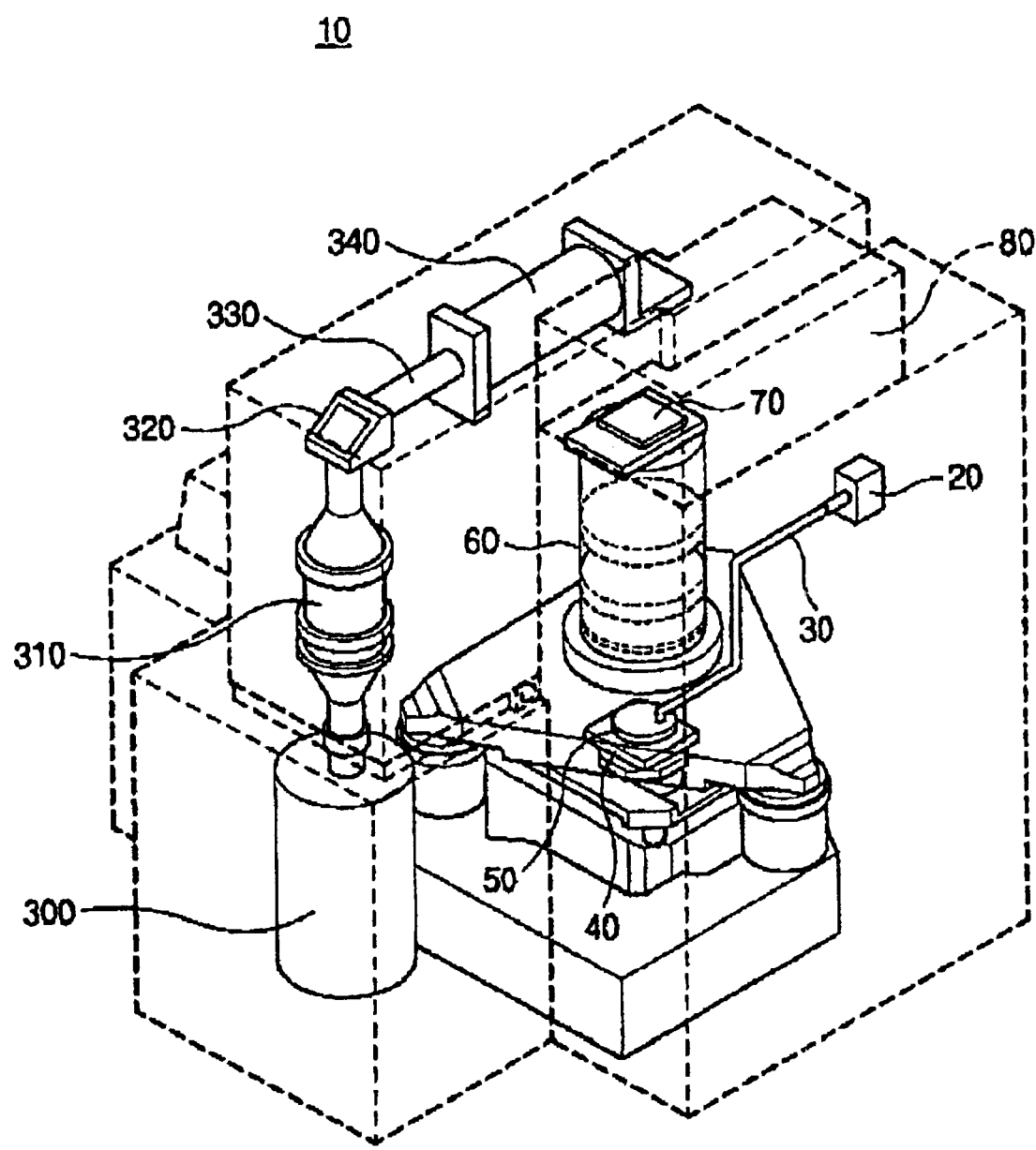
FIG. 2 is a schematic diagram of an exposure apparatus according to the present invention.

FIG. 2 shows a semiconductor exposure apparatus, namely a stepper 10. Light for the exposure process is emitted from a light source 300. The emitted light passes through an aperture 310 for shaping or reducing the intensity of the light. The light passing through the aperture 310 is reflected by a reflection mirror 320. The reflected light is converted into a point light source in an integrator 330. The light converted by the integrator 330 passes through an optical apparatus 340 including a condensing lens or the like. The light is then directed through a reticle 70 and a projection lens 60, whereupon a wafer 50 is exposed. The reticle 70 bears the images of circuit patterns which are to be transcribed by the exposure light onto the wafer 50.

The stepper 10 also aligns the reticle and wafer, which is the most crucial step before the actual exposure process is performed. To this end, an alignment system 100 (FIGS. 2 and 3) includes a light source 20, a beam transfer unit 30, a wafer stage 40, the projection lens 60 and reticle 70, and an alignment detector 80.

Figure 3:
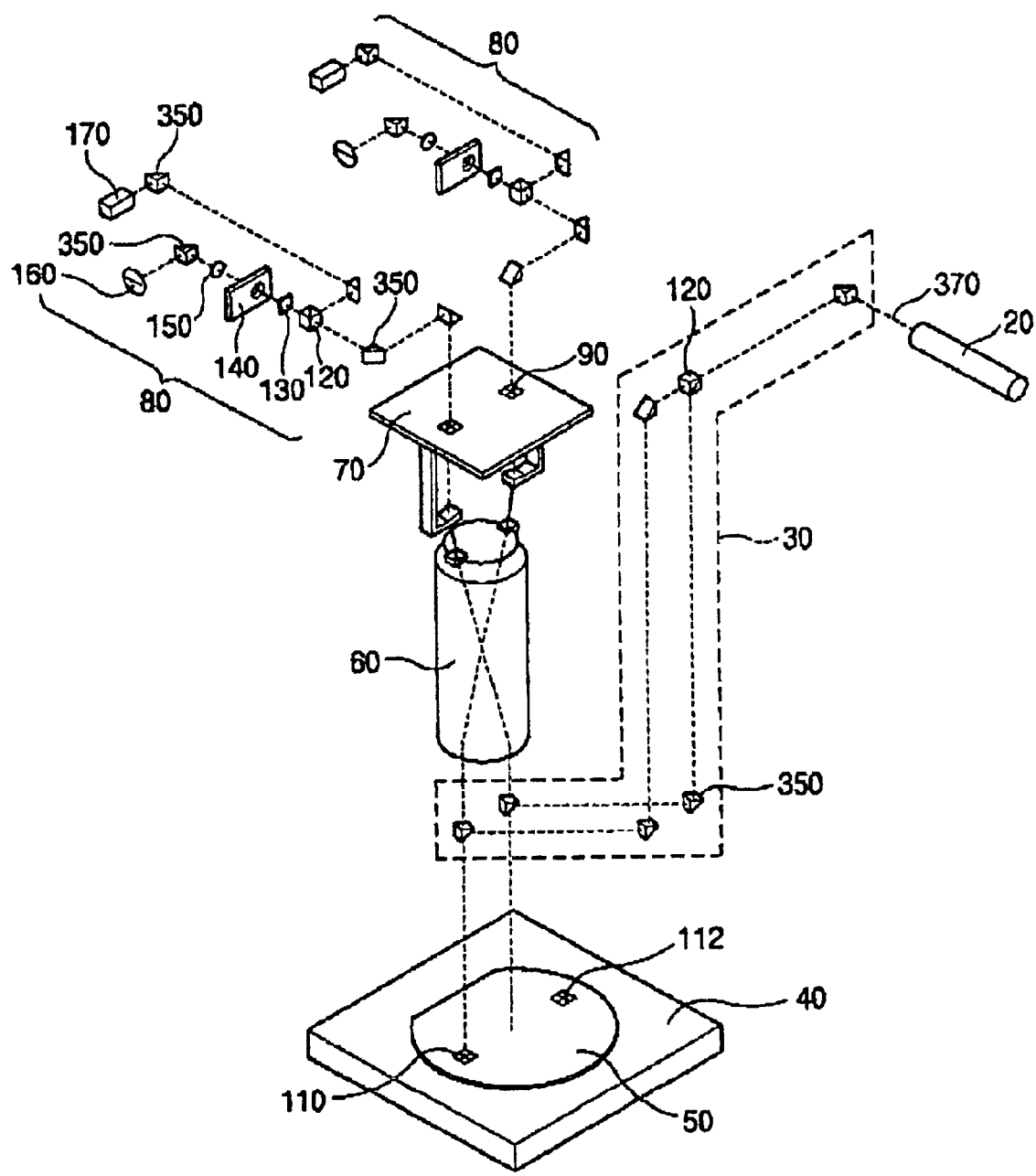
FIG. 3 is an exploded diagram of an alignment system according to the present invention.

More specifically, an alignment beam 370 emitted from the light source 20 passes through the beam transfer unit 30, as shown in FIG. 3. There, the beam 370 is divided into two beams by a splitter 120. The two beams are reflected by prisms 350 so as to travel towards the wafer 50 while propagating perpendicularly to the wafer stage 40. One of the beams is reflected from a first alignment mark 110 on the wafer 50, and the other of the beams is reflected from a midpoint of the wafer, through the projection lens 60. The beams passing through the projection lens 60 then pass through two reticle alignment marks 90 of the reticle 70, respectively, thereby picking up the images of the reticle alignment marks 90. The beams having acquired image information from the above-described process are then divided into four beams by an alignment detector 80.

Figure 4:
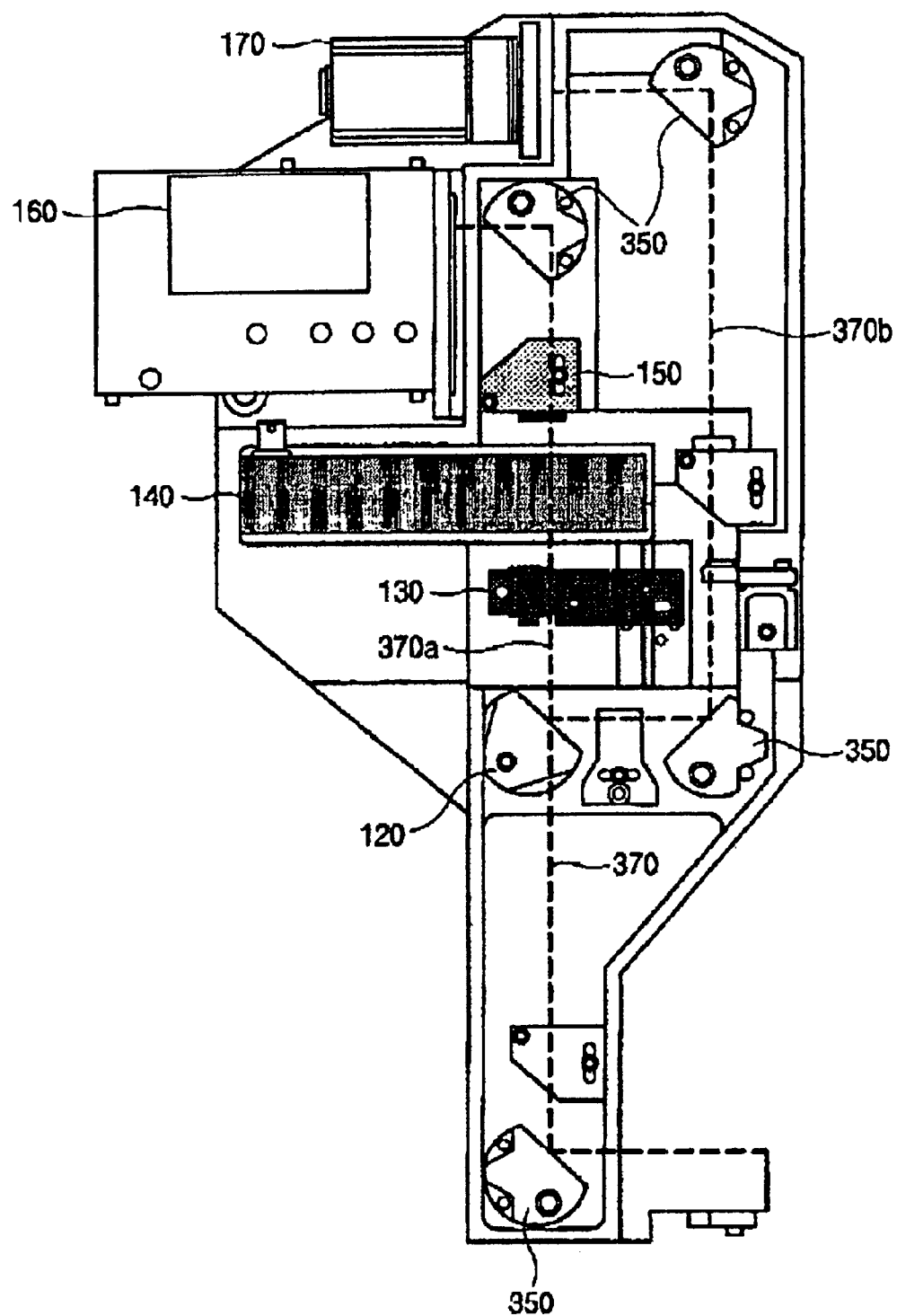
FIG. 4 is a top view of an alignment detector according to the present invention.
Figure 6:
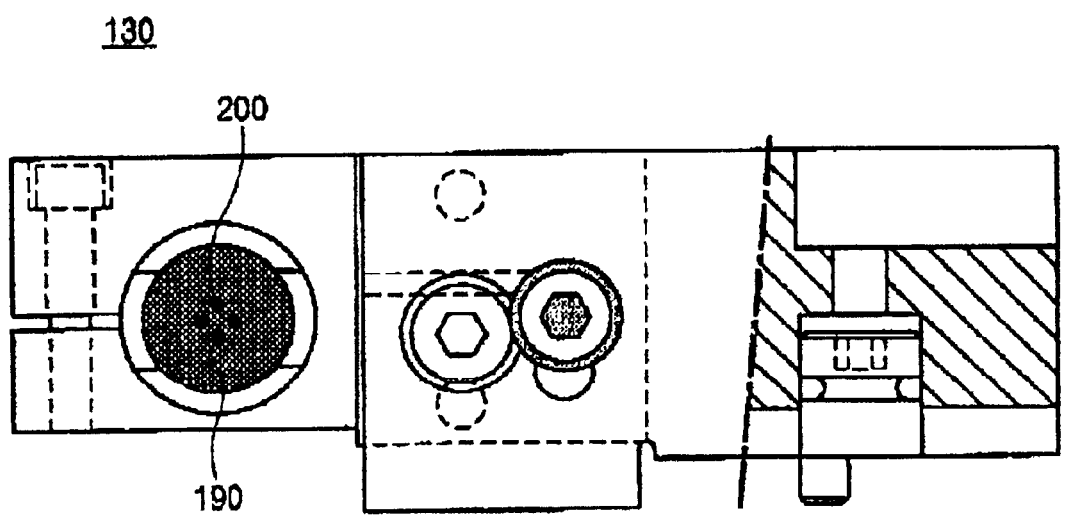
FIG. 6 is a front view of the diaphragm according to the present invention.

As shown best in FIG. 3 and FIG. 4, the alignment beams entering the alignment detector 80 are reflected by prisms 350. The reflected beams are each divided into two beams 370a and 370b by a splitter 120 of the alignment detector 80. One beam 370b is reflected by another prism 350 and is directed to a monitor 170 by which it can be observed with the naked eye. The other beam 370a passes through four holes 200 of a diaphragm (FIG. 6). The beam 370a passing through the diaphragm is modulated and converted by a modulator 140 and an analyzer 150 so as to acquire characteristics making the beam 370a suitable for signal analysis. The beam 370a passing through the analyzer 150 is directed onto a quadrant optical sensor 160 by another prism 350. The quadrant optical sensor 160 is connected to a main control system (not shown) for managing the stepper 10. The beam 370a sensed by the quadrant optical sensor 160 is signal-processed to determine the state of alignment between the wafer 50 and the reticle 70. If an identical phase is sensed in two signals generated from light that has passed through the wafer alignment mark 110 and the reticle alignment mark 90, the alignment of the wafer 50 and reticle 70 is determined to be satisfactory. If not, the alignment is determined to be unsatisfactory, which determination is displayed on a monitor of the main control system.

Once the alignment process employing the first alignment mark 110 is finished, the wafer stage 40 is rotated to check the alignment again in the same manner as described above but, in this case, using a second wafer alignment mark 112.

Figure 5:
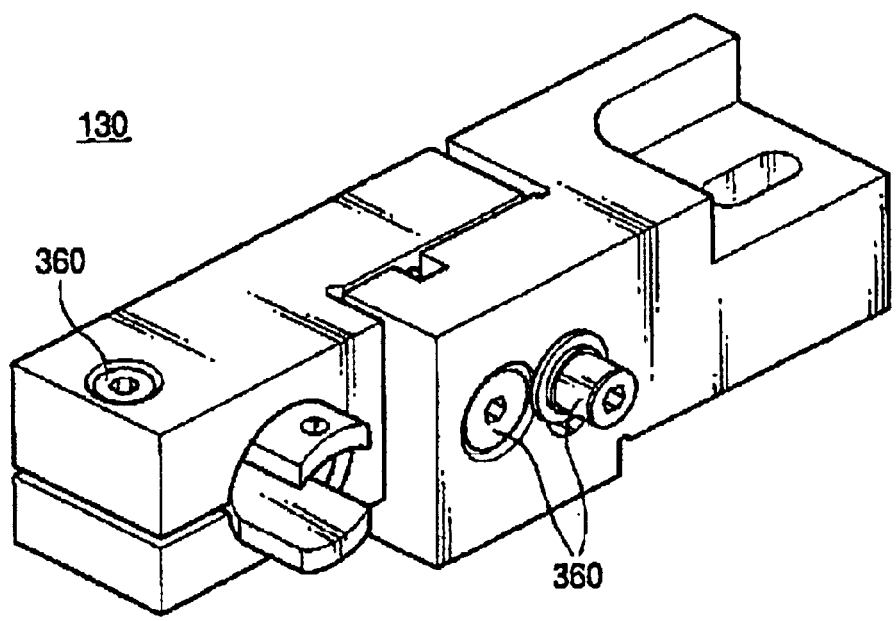
FIG. 5 is a perspective view of a diaphragm according to the present invention.

As shown in FIG. 5 and FIG. 6, the diaphragm 130 includes couplings 360 that allow body parts the diaphragm, including the part through which the alignment beam 370a passes, to be repositionable and removable. In setting up the alignment apparatus, the couplings 360 are loosened and the various parts of the diaphragm 130 shown in FIG. 5 and FIG. 6 are adjusted/oriented so that +/−primary order beam of the alignment beam 370a will pass accurately through the holes of the diaphragm 130. Preferably, the diaphragm 130 has four such holes 200. A photodiode sensor 190 is provided at one side of the diaphragm 130. The photodiode sensor 190 generates current when secondary or higher order beams, caused by dispersion or tilt contact therewith or a tilted +/−primary order beam caused by deterioration or long-term use of the apparatus, impinges the surface thereof.

The photodiode sensor 190 has the same size as the surface of that part of the diaphragm onto which the beams are directed, namely the discrete part of the diaphragm having the four holes 200. The photodiode sensor 190 also has four holes 230 at positions corresponding to the holes 200 of the diaphragm 130. The beams passing through the reticle 70 may become tilted relative to the optical axis due to deterioration or damage and long-term use of the apparatus. In such a case, secondary or higher order beams are present between the reticle 70 and the diaphragm 130, and are sensed by the photodiode sensor 190. The photodiode sensor 190 generates a current in proportion to the intensity of the sensed beams.

Figure 7:
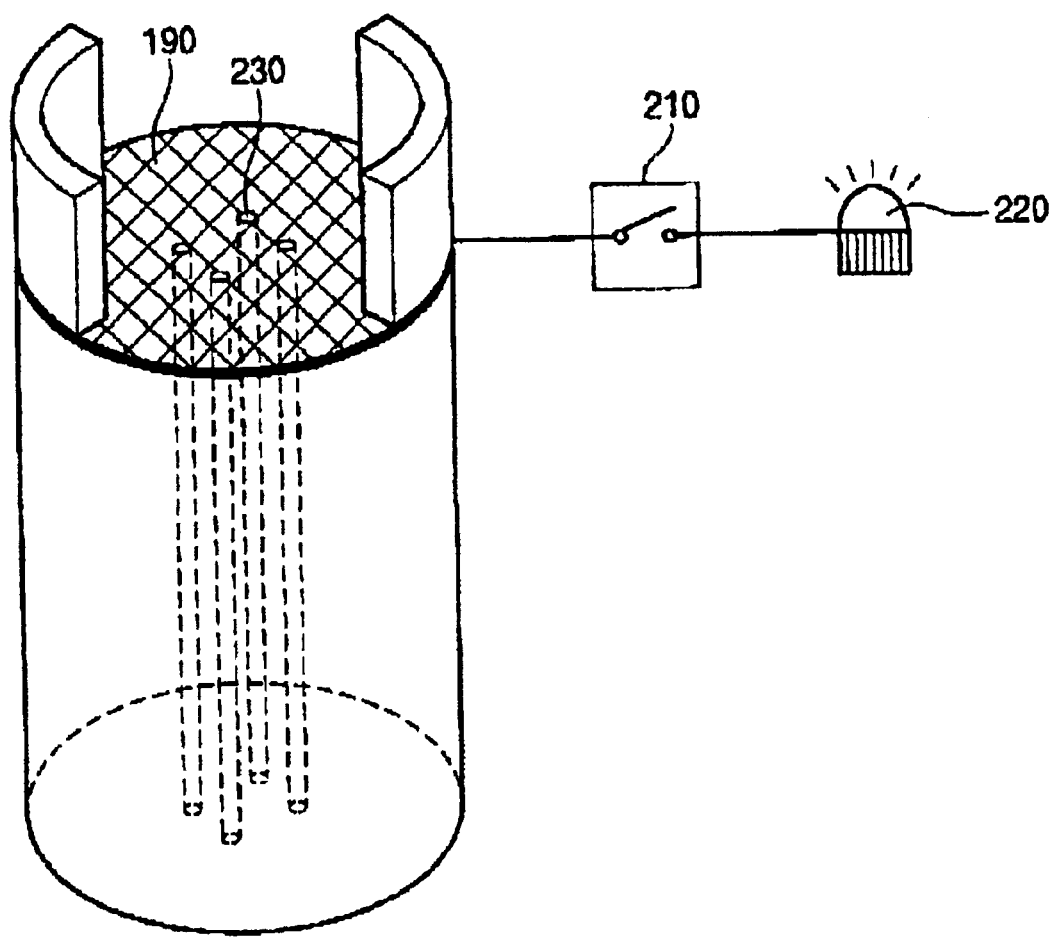
FIG. 7 is a schematic diagram of an alarm device and a controller connected to sensing means of the diaphragm according to the present invention.

FIG. 7 shows an alarm device 220 and a controller 210 connected to the photodiode sensor 190 according to the present invention. The controller 210 senses current generated from the photodiode sensor 190 to control the operation of the alarm device 220. The controller 210 has a set critical voltage at which the alarm device is operated. The critical voltage of the controller 210 is set to a value corresponding to the case in which the photodiode sensor 190 detects a certain tilt of the alignment beam or detects secondary or higher order beams. That is, if a value exceed the setting of the controller 210 is outputted from the photodiode sensor 190, the critical voltage of the controller 210 is exceeded, whereby the controller 210 undergoes a switching operation that activates the alarm device 220. The alarm is used to inform an operator to check whether the apparatus is defective.

Although the present invention has been shown and described with respect to the preferred embodiment thereof, numerous variations and alternate embodiments will become apparent to those skilled in the art. Accordingly, the present invention is not limited solely to the specifically described illustrative embodiment. Rather, variations and alternate embodiments are seen to be within the true spirit and scope of the invention as defined by the appended claims.

What is claimed is:

1. An alignment system of a semiconductor exposure apparatus, comprising:

a light source;

a wafer stage dedicated to support a wafer;

a beam transfer having optical elements that direct light from the light source towards the wafer stage, whereby the light can impinge an alignment mark on a wafer supported on the stage;

a reticle bearing an alignment mark;

a projection lens optically interposed between said reticle and said wafer stage, whereby the lens will project light reflected from the alignment mark of a wafer supported on the stage through the reticle; and an alignment detector positioned in the system to receive the reflected light projected through the reticle by the projection lens, said detector including a diaphragm having a plurality of holes through which light from the reticle can pass, sensing means for sensing secondary or higher order beams generated by light reflected through the alignment mark of the reticle, and a quadrant optical sensor positioned to receive the light that passes through the diaphragm.

2. The system as claimed in claim 1, wherein the sensing means is a photodiode sensor.

3. The system as claimed in claim 2, wherein the photodiode sensor is mounted on an incident side of the diaphragm where the light enters the diaphragm.

4. The system as claimed in claim 2, wherein the photodiode sensor has holes at positions corresponding to the holes of the diaphragm.

5. The system as claimed in claim 4, wherein the number of the holes of the photo diode sensor is four.

6. The system as claimed in claim 2, and further comprising an alarm, and a controller operatively connected to said photodiode sensor and to said alarm so as sense current generated by the photodiode sensor and control the operation of the alarm based on said current.

7. The alignment system of claim 1, wherein the alignment detector further comprises a modulator and an analyzer both interposed between the diaphragm and the quadrant optical sensor, and a monitor that receives light from said modulator and analyzer and allows the light to be viewed with the naked eye.

8. A diaphragm unit for use in an alignment system of a semiconductor exposure apparatus, said unit comprising: a diaphragm having a plurality of holes therethrough, and a photodiode sensor mounted to an incident side of said diaphragm, said photodiode sensor having holes therethrough of the same number as and respectively aligned with the holes of said diaphragm.

9. The diaphragm unit of claim 8, wherein the number of holes of said diaphragm and photodiode sensor is four.

* * * * *